(12) United States Patent
Jung

(10) Patent No.: US 7,270,933 B2
(45) Date of Patent: Sep. 18, 2007

(54) ORGANIC ANTI-REFLECTIVE COATING COMPOSITION AND METHOD FOR FORMING PHOTORESIST PATTERN USING THE SAME

(75) Inventor: Jae Chang Jung, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/979,837

(22) Filed: Nov. 2, 2004

(65) Prior Publication Data

US 2005/0112497 A1    May 26, 2005

(30) Foreign Application Priority Data

Nov. 20, 2003  (KR) .................. 10-2003-0082701

(51) Int. Cl.
    *G03C 1/492*   (2006.01)
(52) U.S. Cl. .................. 430/270.1; 430/311; 430/319; 430/349; 430/434; 430/494

(58) Field of Classification Search .................. None
    See application file for complete search history.

(56) References Cited

U.S. PATENT DOCUMENTS

| 6,338,934 B1 | 1/2002 | Chen et al. |
| 6,395,451 B1 | 5/2002 | Jung et al. |
| 2004/0076910 A1* | 4/2004 | Rutter et al. ................ 430/311 |
| 2005/0215713 A1* | 9/2005 | Hessell et al. ............. 525/162 |

* cited by examiner

*Primary Examiner*—Barbara L. Gilliam
(74) *Attorney, Agent, or Firm*—Marshall, Gerstein & Borun LLP

(57) ABSTRACT

An organic anti-reflective coating composition and a method for forming a photoresist pattern using the same in order to improve uniformity of the pattern in an ultra-fine pattern formation process of the photoresist. In one aspect, organic anti-reflective coating composition contains a light absorbent agent, a cross-linking agent, a thermal acid generator, and a formanilide photo-base generator.

22 Claims, 1 Drawing Sheet collapse phenomenon of pattern

ORGANIC ANTI-REFLECTIVE COATING COMPOSITION AND METHOD FOR FORMING PHOTORESIST PATTERN USING THE SAME

BACKGROUND

1. Technical Field

Organic anti-reflective coatings and methods for forming photoresist patterns using the same are disclosed. The disclosed anti-reflective coatings improve uniformity of the photoresist pattern formed via ultra-fine pattern formation processes. More particularly, the disclosed organic anti-reflective coatings can prevent excessive generation of acid in an exposed portion of the pattern caused by the photo acid generator and can inhibit acid from diffusing up to the other unexposed portions which otherwise can lead to damage or collapse of the photoresist patterns. Methods for forming a photoresist pattern using the same are also disclosed.

2. Description of the Related Art

In recent years, as a resulted of advances in high integration and micro-fine formation of semiconductors, chemical-amplified photoresists have been created that make it possible to provide highly photo-sensitive and ultra-fine patterns, the photoresists a combination of a specified polymer having a specific structure sensitive to acid and an additional photo-acid generator.

Such chemical-amplified photoresists have a functional mechanism where the photo-acid generator generates acid at an exposed portion where the photoresist receives light from a light source and the generated acid then can react with the polymer during a further baking process after exposure which can lead to decomposition of the polymer at or near the exposed portion. In turn, the photoresist in the exposed portion includes the decomposed polymer which is then dissolved in the development solution then removed. With no generation of acid in the portion not exposed to light, the polymer is not decomposed and the photoresist is allowed to remain, thereby producing an accurate photoresist pattern.

However, the photoresist pattern formation process described above (hereinafter abbreviated as the "patterning method") is problematic in that the acid generated in the exposed portion diffuses upward to another portion not exposed to light during the exposure process and/or a process for delaying after exposure (hereinafter referred to as "the time-delay process"). Thus, the acid can cause damage of the photoresist pattern existing in the unexposed portion (hereinafter referred to as "the non-exposure portion"). In particular, in a region, a so-called peri-region, having wider intervals between the photoresists in the non-exposure portion, the acid was excessively generated depending on the extent or area of the exposed portion. Accordingly, the acid can cause collapse of the photoresist pattern due to the deterioration of the polymer in the non-exposure portion.

Therefore, a strong demand exists for an improved technique to protect the non-exposure portion of photoresist from being damaged and/or collapse of the photoresist pattern due to acid-diffusion. In particular, conventionally known processes for preventing such an acid-diffusion phenomenon have used a chemical-amplified photoresist composition together with weak basic amine or amide compounds as an additive to neutralize the acid.

Because such amine or amide compounds have high light absorbance in an ultra-short wavelength region of less than 250 nm, for example, the wavelength of KrF (248 nm) or ArF (193 nm), the amine and amide compounds have the drawback of lowering the sensitivity of the photoresist compositions. Accordingly, there is still a need for a technical development for inhibiting collapse of photoresist pattern caused by acid-diffusion toward the non-exposure portion without reducing the sensitivity of the photoresist composition.

Meanwhile, in order to prevent damage to the photoresist pattern, which may occur by reflected light and diffracted light from the bottom film layer, an anti-reflective coating was introduced between the photoresist film and the bottom film layer. Typically, organic anti-reflective coatings are used, which are produced from a composition comprising a light absorbent agent, a cross-linking agent, a thermal acid generator and an organic solvent.

Briefly, these organic anti-reflective coating compositions form cross-linkage bonds between the cross-linking agent and the thermal acid generator. The resultant organic anti-reflective coating is not dissolved in a photoresist solvent, and can be favorably formed between the photoresist film and the bottom film layer. Since the organic anti-reflective coating includes the light absorbent agent having a higher light absorbance then the typical light source used in the photoresist pattern formation process, the anti-reflective coating can protect the photoresist pattern against reflected light and diffracted light from the bottom film layer, thereby improving uniformity of the pattern.

However, it was found that the introduction of such organic anti-reflective coatings described above only prevent damage to the photoresist pattern induced by the reflected light and the diffracted light from the bottom film layer. These coatings did not achieve inhibition of damage to the photoresist pattern caused by the acid-diffusion toward the non-exposure portion as described earlier.

SUMMARY OF THE DISCLOSURE

Novel organic anti-reflective coatings are disclosed that can effectively protect or prevent collapse of a photoresist pattern caused by acid-diffusion toward a non-exposure portion without reducing the sensitivity of the photoresist film. A method for forming a photoresist pattern using the same is also disclosed.

An organic anti-reflective coating is disclosed which comprises a light absorbent agent, a cross-linking agent, a thermal acid generator and an organic solvent and, additionally, a photo-base generator.

A disclosed organic anti-reflective coating further comprises a photo-base generator which can radiate a base as the photo-base generator receives light from a light source having a constant wavelength used in the patterning process. The disclosed coating composition can neutralize acids with the base generated by the photo-base generator to prevent damage and collapse of photoresist pattern caused by the acid-diffusion to the non-exposure portion of the pattern. In particular, when the above organic anti-reflective coating is used below a the photoresist pattern, the anti-reflective coating generates a sufficient amount of base even for a substantial peri-region with excessive acid due to the enlarged portion to be exposed, thereby preventing collapse of the photoresist pattern in the peri-region.

Furthermore, the disclosed coating does not add an alternative material to the photoresist composition which may affect the photosensitivity of the photoresist film. Instead, the anti-reflective coating improves the collapse resistance of the photoresist pattern caused by the acid-diffusion through the organic anti-reflective coating disposed below the photoresist film. Thus, the anti-reflective coating can accomplish this effect described above without any reduction in photo-sensitivity of the photoresist film.

The photo-base generator used can vary and many are known by those skilled in the art. However, when using a light source with a 193 nm ArF wavelength, the photo-base generator preferably comprises formanilide. By using formanilide as the photo-base generator, the fomanilide will efficiently inhibit damage to or collapse of the photoresist pattern induced by the acid-diffusion to the non-exposure portion in an ultra-fine pattern formation process using a 193 nm ArF light source.

Additionally, a disclosed organic anti-reflective coating composition generally includes conventional materials used as light absorbent agents, and one can obviously select and use well-known materials having a higher light absorbance depending on the kind of the light source applied in the patterning process.

Particularly, in the ultra-fine pattern formation process using 193 nm ArF as the light source, the anti-reflective coating composition may comprise polyvinylphenol having a structure of Formula 1 as the light absorbent agent. This polymer as the light absorbent agent (hereinafter referred to as "the light absorbing polymer") is broadly used in prior art and can be produced by a conventional method for preparing the polymer.

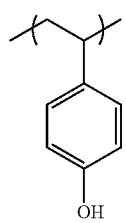

Formula 1

Also, a polymer as the cross-linking agent (hereinafter referred to as "the cross-linking polymer") described above may comprise materials as the cross-linking agent usually employed in the conventional organic anti-reflective coating compositions. In particular, a polymer having a structure of the following Formula 2 may be employed as the cross-linking agent.

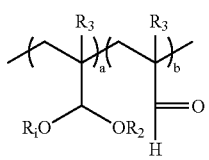

Formula 2 wherein each of $R_1$ and $R_2$ represents an alkyl group or an allyl group having branch chain or straight chain substituted $C_1$-$C_{10}$; $R_3$ represents hydrogen or methyl group; and a mole ratio of a to b ranges from about 0.1 to about 0.9.

The above polymers were previously used as one of the cross-linking agent in the ultra-fine patterning process using a 193 nm ArF light source and its preparation method is well known to those skilled in the technical field.

With regard to the disclosed organic anti-reflective coating composition, the thermal acid generator introduced above may preferably comprise 2-hydroxyhexyl p-toluene sulfonate having a structure of the following Formula 3.

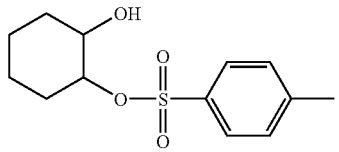

Formula 3

Such a thermal acid generator is a catalyst to activate cross-linkage reaction between the cross-linking agent and the photo-absorbent agent within the organic anti-reflective coating composition. The thermal acid generator generates acid when thermal processes such as a baking process is carried out after applying the organic anti-reflective coating containing the thermal acid generator on a wafer. Sequentially, the cross-linking reaction occurs in the presence of such acid generated to form cross-linkage bonds inside the organic anti-reflective coating, to the organic anti-reflective coating insoluble in the photoresist solvent.

In addition, the disclosed organic anti-reflective coating composition further comprises conventional organic solvent usually added to the organic anti-reflective coating composition and preferably includes, any one selected from ethyl 3-ethoxy propionate, methyl 3-methoxy propionate, cyclohexanone, propyleneglycol methylether acetate (PGMEA), and more preferably propyleneglycol methylether acetate.

The cross-linking polymer of the Formula 2 used in the disclosed organic anti-reflective coating composition may be present in an amount ranging from 50 to 400% by weight relative to the amount of the light absorbing polymer of the Formula 1 in the composition. The thermal acid generator may be present in an amount of 10 to 200% by weight relative to the amount of the light-absorbing polymer in the composition. Likewise, the organic solvent may be present in the range of 1,000 to 10,000% by weight relative to the total amount of the cross-linking agent and the light-absorbing polymer contained in the composition.

Moreover, the photo-base generator is preferably present in an amount ranging from 10 to 200% by weight relative to the amount of the light absorbing polymer present. If such an amount of the photo-base generator is less than the lower limit, the composition may not efficiently neutralize the acid generated nearby the exposed portion of the photoresist then diffused to the non-exposure portion, thereby not sufficiently preventing damage to the pattern caused by the acid-diffusion. While the composition contains more than 200% by weight of the photo-base generator, it may generate excessive amounts of base leading to damage of the pattern due to the base.

A disclosed method for forming photoresist pattern comprises (a) coating an organic anti-reflective coating composition on the top portion of a layer to be etched; (b) conducting a baking process for the obtained material to generate cross-linkage bonds, thereby forming an organic anti-reflective coating; (c) applying a photoresist on top portion of the formed organic anti-reflective coating, exposing and developing the photoresist to produce the desired photoresist pattern.

Briefly, such a patterning method comprises using the organic anti-reflective coating composition to produce the photoresist pattern so that it can eliminate damage to and/or collapse of the photoresist pattern caused by acid generated near the exposed portion and diffused to the non-exposure portion. In addition, the disclosed method prevents damage of the pattern induced by scattered reflection from the bottom film layer due to the organic anti-reflective coating containing the above light absorbing polymer, thereby resulting in an improved perpendicular pattern.

In the disclosed patterning process, the baking process is preferably performed at a temperature ranging from about 150 to 300° C. for a time period ranging from 1 to 5 minutes. By conducting the baking process under these conditions, the thermal acid generator generates acid to form cross-linkage bonds in the anti-reflective coating, in turn, renders the anti-reflective coating insoluble in a photoresist solvent.

Additionally, the disclosed patterning process further comprises an additional baking process before or after the exposure process among the steps mentioned above to form the pattern, which is preferably conducted at a temperature ranging from 70 to 200° C.

Although the disclosed anti-reflective coating composition and the disclosed patterning process are mostly adapted to ultra-fine pattern formation processes using an ArF light source with 193 nm, they can be also applied to other ultra-fine pattern formation processes using KrF, DUV including EUV, E-beam, X-ray or ionic beams.

Finally, a semiconductor device is produced by the disclosed patterning process.

BRIEF DESCRIPTION OF THE DRAWINGS

Other aspects of this disclosure will become apparent from the following description and examples with reference to the accompanying drawings, wherein.

DESCRIPTION OF THE PRESENTLY PREFERRED EMBODIMENTS

The following examples are intended to be only illustrative only and are not intended to limit the scope of this disclosure.

COMPARATIVE EXAMPLE 1

Preparation of an Organic Anti-Reflective Coating Composition According to the Prior Art.

0.5 g of cross-linking polymer represented by the following Formula 4, 0.5 g of polyvinylphenol as a light absorbent agent represented by the following Formula 1 and 0.085 g of 2-hydroxyhexyl p-toluene sulfonate represented by the following Formula 3 were dissolved in 50 g of propyleneglycol methylether acetate. The solution obtained was filtered through a fine filter having a 0.2 μm pore size to produce the conventional organic anti-reflective coating composition.

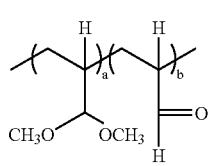

Formula 4 wherein each of $R_1$ and $R_2$ represents an alkyl group or allyl group having a branched chain or straight chain substituted $C_1$-$C_{10}$; $R_3$ represents hydrogen or methyl group; and a and b represent the mole ratio of the respective monomers of 0.1 to 0.9.

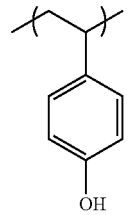

Formula 1

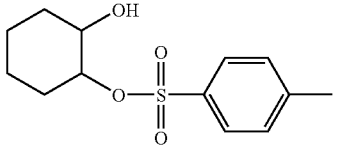

Formula 3

EXAMPLE 1

Preparation of a Disclosed Organic Anti-Reflective Coating Composition.

A disclosed organic anti-reflective coating composition was prepared in the same manner as in Comparative Example 1 except that 0.1 g of formanilide was added to the components described in Comparative Example 1.

COMPARATIVE EXAMPLE 2

Formation of a Disclosed Photoresist Pattern.

On a silicone wafer, the organic anti-reflective coating composition of Comparative Example 1 was coated at a thickness of 35 nm, then subjected to a baking process at 240° C. for 90 seconds to form cross-linkage bond, thereby obtaining the conventional organic anti-reflective coating.

Thereafter, on the wafer formed with the organic anti-reflective coating, AR 1221 J (manufactured by JSR) as one of the 193 nm photo-sensitive agents was coated in a thickness of 0.2 μm, then treated with a baking process at 130° C. for 90 seconds. After conducting the baking process, an exposure process was carried out by an ArF scanner (NA=0.75) of ASML Co., Ltd. and followed by a further post-baking process at 130° C. for 90 seconds. After completion of the baking process, the baked product was put under a development process with 2.38% by weight of tetramethyl ammonium hydroxide (TMAH) solution developed to obtain a final photoresist pattern.

Figure 1:
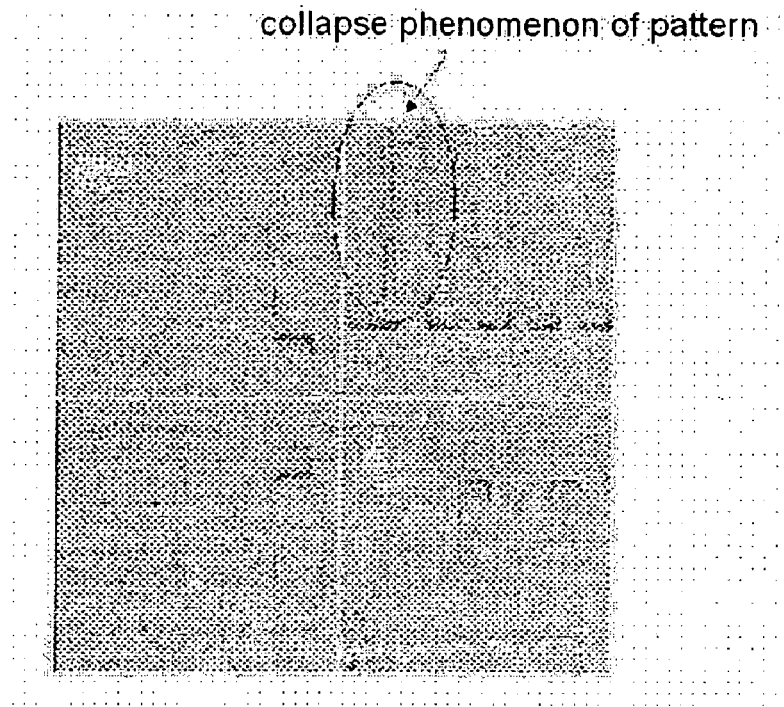
FIG. 1 is a photograph showing a photoresist pattern formed by a prior art illustrating collapse of the pattern occurred therein.

The photoresist pattern formed by the above method was illustrated in FIG. 1.

EXAMPLE 2

Formation of a Disclosed Photoresist Pattern.

On a silicone wafer, the organic anti-reflective coating composition of Example 1 was coated with a thickness of 35 nm, then subjected to a baking process at 240° C. for 90 seconds to form cross-linkage bonds, thereby obtaining the desirable organic anti-reflective coating.

Thereafter, on the wafer formed with the organic anti-reflective coating, AR 1221 J (manufactured by JSR) as one of the 193 nm photo-sensitive agents was coated at a thickness of 0.2 µm, then treated by a baking process at 130° C. for 90 seconds. After conducting the baking process, an exposure process was carried out by an ArF scanner (NA=0.75) of ASML Co., Ltd. and followed by a further post-baking process at 130° C. for 90 seconds. After completion of the baking process, the baked product was under a development process with 2.38% by weight of tetramethyl ammonium hydroxide (TMAH) solution developed to obtain a final photoresist pattern.

Figure 2:
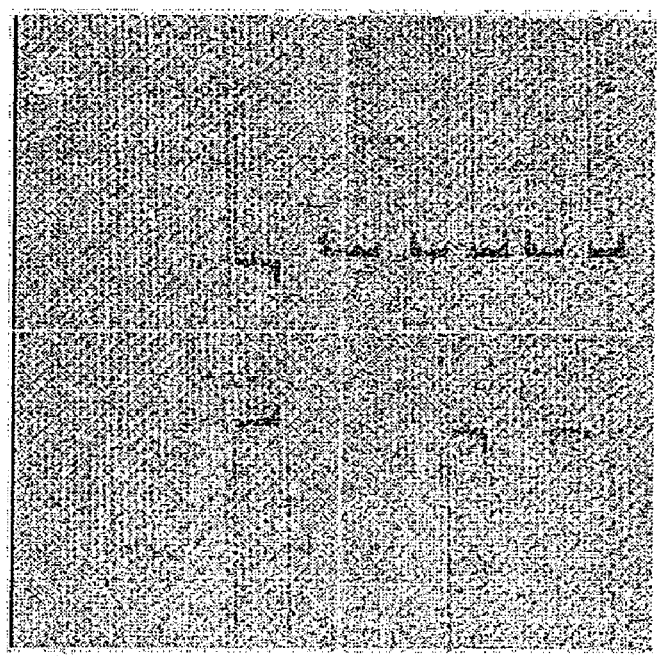
FIG. 2 is a photograph showing a photoresist pattern formed by using a disclosed organic anti-reflective coating composition comprising a photo-base generator, which prevents no collapse of the pattern but formation of high quality perpendicular pattern.

The photoresist pattern formed by the above method was illustrated in FIG. 2.

As illustrated in the accompanying FIGS. 1 and 2, it can be observed that collapse of the prior art photoresist pattern was caused by diffused acid on the non-exposure portion in case of the conventional patterning process. However, the disclosed method neutralizes the diffused acid by using the photo-base generator for an improved perpendicular photoresist pattern with no collapse of the photoresist pattern.

As above mentioned, according to this disclosure, it is possible to solve problems such as damage or collapse of photoresist pattern induced by excessive acid diffusing to non-exposure portions. Even when the excessive acid is generated in a peri-region having wider intervals between the photoresist patterns, the acid can be completely neutralized by the base to inhibit collapse of the pattern induced by the acid, in addition to, to maintain the sensitivity of the photoresist.

Accordingly, it is possible to form an improved perpendicular photoresist pattern by applying the disclosed organic anti-reflective coating composition, whereby the disclosed anti-reflective coating can significantly contribute to the improvement of the yield in the semiconductor production process.

It will be obvious that the disclosed organic anti-reflective coatings and manufacturing methods may be varied in many ways. Such variations are not to be regarded as a departure from the spirit and scope of this disclosure as all such modifications as would be obvious to those skilled in art are intended to fall within the spirit and scope of this disclosure and the following claims.

What is claimed is:

1. An organic anti-reflective coating composition comprising:
    a light absorbent agent, a cross-linking agent, a thermal acid generator, an organic solvent, and a photo-base generator, said cross-linking agent comprising a polymer having a structure represented by the Formula 2:

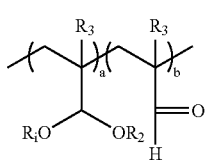

Formula 2 wherein each of $R_1$ and $R_2$ represents a branched chain or straight chain substituted $C_1$-$C_{10}$ alkyl group or allyl group; $R_3$ represents hydrogen or a methyl group; and a molar ratio of monomer a to monomer b ranges from 0.1 to 0.9.

2. The composition according to claim 1, wherein the light absorbent agent is polymer having a structure represented by Formula 1:

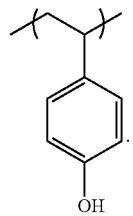

Formula 1

3. The composition according to claim 1, wherein the thermal acid generator is a compound having a structure represented by the following formula 3:

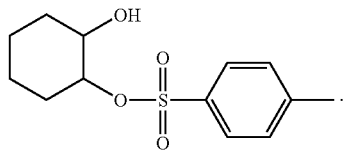

Formula 3

4. The composition according to claim 3, wherein the thermal acid generator is present in an amount ranging from 10% to 200% by weight relative to the amount of the light absorbent agent.

5. The composition according to claim 1, wherein the organic solvent is selected from the group consisting of ethyl 3-ethoxypropionate, methyl 3-methoxypropionate, cyclohexanone, propyleneglycol methylether acetate, and mixtures thereof.

6. The composition according to claim 5, wherein the organic solvent is present in an amount ranging from 1,000% to 10,000% by weight relative to the combined amount of the cross-linking agent and the light absorbent agent.

7. The composition according to claim 1, wherein the cross-linking agent is present in an amount ranging from 50% to 400% by weight relative to the amount of the light absorbent agent.

8. The composition according to claim 1, wherein the photo-base generator is present in an amount ranging from 10% to 200% by weight relative to the amount of the light absorbent agent.

9. A method for forming a photoresist pattern comprising:
    (a) coating an organic anti-reflective coating composition according to claim 1 on a layer to be etched;
    (b) conducting a baking process on the material obtained from (a) step to form cross-linkage bond and, in turn, an organic anti-reflective coating; and
    (c) applying a photoresist on the top portion of the formed organic anti-reflective coating, exposing and developing the coating to produce a photo-resist pattern.

10. The method according to claim 9, comprising carrying out the baking process at a temperature ranging from 150° C. to 300° C. for one minute to five minutes.

11. The method according to claim 9, further comprising an additional baking process before or after said exposure step.

12. The method according to claim 11, comprising carrying out the baking process at a temperature ranging from 70° C. to 200° C.

13. The method according to claim 9, comprising applying the method to an ultra-fine pattern formation process using $F_2$, ArF, KrF, or DUV including EUV, E-beam, X-ray or an ionic beam.

14. A semiconductor device produced by the method according to claim 9.

15. The composition according to claim 1, wherein the photo-base generator is formanilide.

16. A method for forming a photoresist pattern comprising:

(a) coating an organic anti-reflective coating comprising a photo-base generator and a cross-linking agent on a layer to be etched, said cross-linking agent comprising a polymer having a structure represented by the Formula 2:

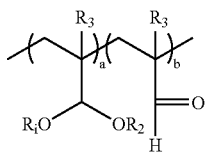

Formula 2 wherein each of $R_1$ and $R_2$ represents a branched chain or straight chain substituted $C_1$-$C_{10}$ alkyl group or allyl group; $R_3$ represents hydrogen or a methyl group; and a molar ratio of monomer a to monomer b ranges from 0.1 to 0.9;

(b) conducting a baking process on the material obtained from (a) step to form cross-linkage bond and, in turn, an organic anti-reflective coating; and (c) applying a photoresist on top portion of the formed organic anti-reflective coating, and exposing and developing the coating to produce a photo-resist pattern.

17. The method according to claim 16, comprising carrying out the baking process at a temperature ranging from 150° C. to 300° C. for one minute to five minutes.

18. The method according to claim 16, further comprising an additional baking process before or after said exposure step.

19. The method according to claim 16, comprising carrying out the baking process at a temperature ranging from 700° C. to 200° C.

20. The method according to claim 16, comprising applying the method to an ultra-fine pattern formation process using $F_2$, ArF, KrF, a DUV including EUV, E-beam, X-ray or an ionic beam.

21. A semiconductor device produced by the method according to claim 16.

22. The composition according to claim 16, wherein the photo-base generator is formanilide.

* * * * *